(12) United States Patent
Leu

(10) Patent No.: US 10,228,421 B2
(45) Date of Patent: Mar. 12, 2019

(54) METHOD AND SYSTEM FOR INTELLIGENT DEFECT CLASSIFICATION AND SAMPLING, AND NON-TRANSITORY COMPUTER-READABLE STORAGE DEVICE

(71) Applicant: ELITE SEMICONDUCTOR, INC., Hsinchu County (TW)

(72) Inventor: Iyun Leu, Hsinchu (TW)

(73) Assignee: Elite Semiconductor, Inc., Hsinchu County (TW)

( * ) Notice: Subject to any disclaimer, the term of this patent is extended or adjusted under 35 U.S.C. 154(b) by 130 days.

(21) Appl. No.: 15/171,530

(22) Filed: Jun. 2, 2016

(65) Prior Publication Data

US 2017/0212168 A1 Jul. 27, 2017

(30) Foreign Application Priority Data

Jan. 25, 2016 (TW) .............................. 105102190 A

(51) Int. Cl.
*G01R 31/3177* (2006.01)
*G01R 31/317* (2006.01)
*H01L 21/66* (2006.01)

(52) U.S. Cl.
CPC ... *G01R 31/3177* (2013.01); *G01R 31/31703* (2013.01); *H01L 22/20* (2013.01); *H01L 22/12* (2013.01)

(58) Field of Classification Search
CPC ..................... G01R 31/3177; G01R 31/31703
See application file for complete search history.

(56) References Cited

U.S. PATENT DOCUMENTS

| 7,602,962 | B2 | 10/2009 | Miyamoto et al. | |
|---|---|---|---|---|
| 7,676,077 | B2 | 3/2010 | Kulkarni et al. | |
| 8,312,401 | B2 | 11/2012 | Leu et al. | |
| 2012/0185818 | A1* | 7/2012 | Leu | G03F 1/84 716/136 |
| 2013/0173041 | A1* | 7/2013 | Leu | G06Q 10/06 700/105 |

(Continued)

FOREIGN PATENT DOCUMENTS

| TW | 200937554 A | 9/2009 |
|---|---|---|
| TW | 201329760 A | 7/2013 |
| TW | 201445347 A | 12/2014 |

*Primary Examiner* — April Y Blair
*Assistant Examiner* — Rong Tang
(74) *Attorney, Agent, or Firm* — Muncy, Geissler, Olds & Lowe, P.C.

(57) ABSTRACT

Disclosure is related to a method and a system for intelligent defect classification and sampling, and a computer-readable storage device. The computer-implemented method acquires in-line defect inspection file, and retrieves the defect patterns over a device under test, e.g. a wafer from a fab. The system incorporates a defect pattern recognition engine to recognize the defect signature patterns from the defect patterns. A sampling scheme is performed to acquire weak defect patterns. A critical area analysis based on failure probability of weak patterns is incorporated to performing the sampling. The defect layout pattern groups probably causing the open or short failure can be obtained. The defect signature patterns through sampling are then displayed using a browsing system. Through a user interface, the user can perform functions, such as filtering, selection and merging, onto the defect patterns.

12 Claims, 14 Drawing Sheets

(56) References Cited

U.S. PATENT DOCUMENTS

| | | | |
|---|---|---|---|
| 2013/0174102 A1* | 7/2013 | Leu | G05B 19/41875 716/52 |
| 2014/0343884 A1* | 11/2014 | Leu | H01L 22/20 702/82 |

* cited by examiner

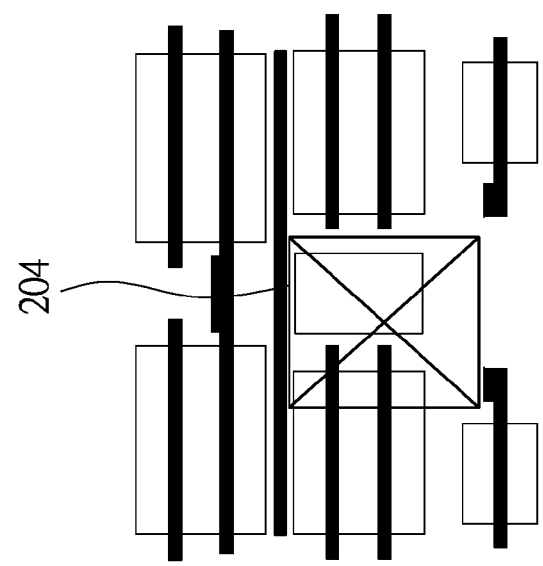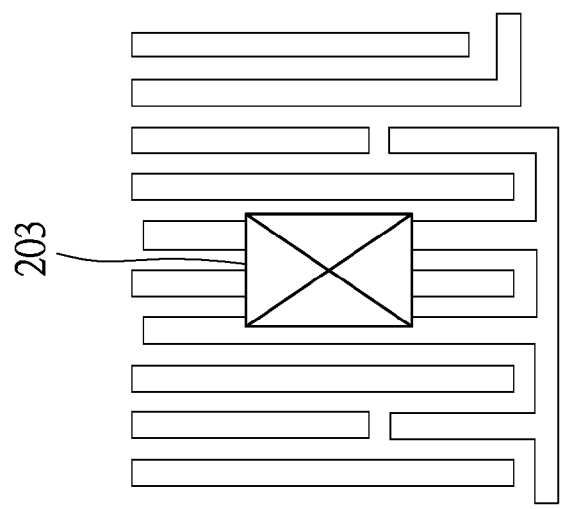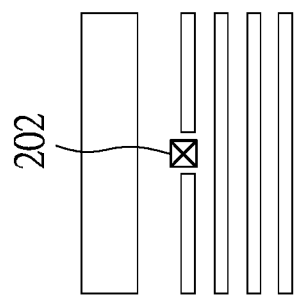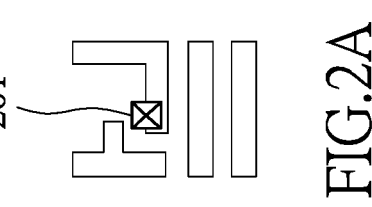

METHOD AND SYSTEM FOR INTELLIGENT DEFECT CLASSIFICATION AND SAMPLING, AND NON-TRANSITORY COMPUTER-READABLE STORAGE DEVICE

BACKGROUND OF THE INVENTION

1. Field of the Invention

The present invention is generally related to a method and a system for intelligent defect sampling, in particular, to the method and system using computer technology to implement defect feature classification and defect sampling in the in-line defect inspection process.

2. Description of Related Art

The systematic defects may be produced during the manufacturing process. The systematic defects are easily occurred over some kinds of design layout patterns and the defects possibly cause vital mistake. In the manufacturing plant, e.g. wafer fab, the any offset in the pattern manufacturing process such as lithography and etching process may produce the weak defect patterns that cause a big problem to the yield of manufacturing. In the conventional technology, a tool of bright field defect inspection and process window design analysis are utilized to find out the weak defect patterns.

SUMMARY OF THE INVENTION

The present invention generally relates to a method and a system for intelligent defect classification and sampling, and further to a computer-readable storage device. In particular, the method and the system are embodied in a software and hardware-implemented framework which is operated especially in a semiconductor fabrication for screening and matching the weak defect patterns in the early stages of the manufacturing process.

In one of the embodiments of the present invention, the method of intelligent defect classification and sampling may be applied to a computer-implemented intelligent defect classification and sampling system. In the method, in the computer system, through a defect inspection tool in a fab, defect inspection data, e.g. PWQ, FEM, or other similar matrix experiment data may be acquired. A defect layout pattern group is incorporated. The method, such as the same applicant's method for screening out the non-killer defect, which is U.S. patent application Ser. No. 13/005,932, filed on Jan. 13, 2011, and issued on Nov. 13, 2012 as U.S. Pat. No. 8,312,401 B2, entitled "Method for smart defect screen and sample", is performed to form the defect layout pattern group.

Further, a defect sampling engine is introduced for conducting defect samples selection within defect layout pattern groups. The selected sampled defects are used to create defect pattern images when the systematic defect patterns are confirmed through SEM. In the computer system, the sampled defect images of the top priority defect layout pattern group can be reviewed and verified as systematic defect patterns. Since the defects are regarded as systematic defect patterns, they will be recorded into a weak pattern library.

In the defect sampling process in accordance with the present invention, PWQ, FEM, or other experimental matrix conditions in a wafer may be acquired. Each reticle field shot in a wafer represents a process condition, e.g. the exposure energy and defocus offset condition. After the defect inspection process, huge defect data are detected through the defect inspection tool. The defect sampling selection method is able to screen out fewer but critical sampled defects from the huge defect data made by the defect inspection tool, as some of the sampled defects are valuable defects and some are invalid sampled defects. After that, the method for smart defect screen and sample in accordance with the applicant's previously-filed U.S. patent application Ser. No. 13/005,932 issued as U.S. Pat. No. 8,312,401 B2 is adopted to find out the valuable defect images and patterns resulting in the failure.

First, by analysis of the defect layout pattern groups, the top priority defect layout pattern groups can be found. Based on the condition of the defect layout pattern groups, the method is to define a baseline window referring to the reticle fields of scanned wafer defects. The definition exemplarily includes a region including the baseline window plus one step parameter change outside the respective reticle field shots defects, a region including the baseline window plus two step parameter changes outside conditions with the respective reticle field shots defects; and a region including the baseline window plus three step parameter changes outside conditions with the respective reticle field shots defects. Some more regions with more step parameter changes may be included for containing all the conditions. The defect sampling method picks some defects within the baseline window and includes some further delta parameters.

An SPC probability index is defined. The baseline window is configured to have the defects with +− three sigma occurrence of SPC. For example, one parameter shift from the +− three sigma occurrence of SPC that indicates the area between three sigma SPC and four sigma SPC. Two parameter step units shift from +− three sigma include the area between four sigma SPC and five sigma SPC. The SPC probability index for baseline window condition is 96%. Next, the SPC probability index for one parameter step unit shift from baseline window condition is around 2%. Towards the area away from the baseline window, the SPC probability index is getting smaller, that means the related defects will not occur in the normal manufacturing process. The sampling selection rule is based on defect layout pattern grouping priority. The reference is such as CAA index, and SPC probability index. The weak defect patterns will be found out.

In one further embodiment, the computer-implemented system may be applied to an intelligent defect signature pattern diagnosis system. A processor of the computer system executes the method of intelligent defect classification sampling.

The disclosure is related to a computer-implemented GUI system for defect analysis. The system includes a computer, a GUI software system, a computer input device such as a computer mouse or a touch panel, and a storage device. The system first filters the defect data such as defect, defect wafermap, defect pattern group, merges defects, merge defect pattern groups, and select sampling defect, select sample defect pattern group. Furthermore, the system also defines sample priority and ratio on index die/multi index die or wafermap area or wafermap zone, and performs Offset Calibration. The user can browses the defect pattern, especially by a software-based browsing system, defect wafermap or the defect pattern groups through computer screen, and also determine if the defect pattern groups that have killer defect or systematic defect will result in failure. The user can operate the computer mouse or touch panel to click the filter icon for performing filtering. Through the computer screen, the user can determine the defect pattern groups having the killer defect or systematic defect that possibly results in failure as browsing the pattern groups through the screen. The system also allows the user to select the action such as clicking the select sample button to do the sampling by software.

The user also determines if the different defect pattern groups are separated because of the positions of the defects but they are still the same group since they have the similar or consistent patterns. The user can use the computer mouse or touch panel to click the merge button for merging the groups by software. Further, the user can browse the wafermap defect distribution of the various defect groups through the computer screen, and can preliminarily check if any systematic defect exists and covers the baseline window. In this step, the user can use the computer mouse or his finger to click the touch screen to trigger the filter button for screening the systematic defects. The select sample button is also provided for performing filtering or sampling by software.

To define sample priority and ratio on index die, wafermap area or wafermap zone, the user can select one or more index dies, or the index dies covering a certain area of the waferamp when he/she browses the wafermap or the defect wafermap through the computer screen. The selected index dies, or the index dies covering a certain wafermap area can be within a baseline window, or the baseline window with one delta parameter, or two delta parameters. A priority and ratio button is configured to set up a ratio of sample priority and sampling. The software-based selection sampling tool is used to define the sampling priority of defect groups and defect wafermaps through determination of the defect priority of the defects, defect groups, and defect wafermaps. The defect sampling is also performed according to the defect priority and the ratio. References are made to the present applicant's U.S. Pat. No. 8,473,223 and U.S. Pat. No. 8,312,401. In addition to calibrating error for the defect inspection machine by comparing pattern in the prior technology, a GUI with function of Offset Calibration is used for the calibration of the machine. The computer system generates a defect design picture with a reference point and a ruler. The computer system allows the user to browse the defect design picture and the defect images through computer screen, and simultaneously to draw correspondence of the relative positions of the real defects in the defect images to the positions of defect design picture. The system also allows the user to select the defect by the computer mouse or the touch screen, and to generate an error-calibration value indicative of horizontal and vertical coordinates or distances by clicking the mouse button or an Offset Calibration button. A save button is triggered to store the result to the computer hard drive or memory of the killer defect analysis system. The GUI system therefore provides interfaces of filtering defects and defect pattern groups, merging defects and defect pattern groups, selection sampling defects and defect pattern groups, and defining sample priority and ratio on index die/multi index die or wafermap area or wafermap zone. The Offset Calibration function can increase the accuracy, delivery, and efficiency of sampling the killer defects or weak defect pattern groups.

BRIEF DESCRIPTION OF THE DRAWINGS

The foregoing aspects and many of the attendant advantages of this invention will be more readily appreciated as the same becomes better understood by reference to the following detailed descriptions, when taken in conjunction with the accompanying drawings, wherein:

FIG. 2A through FIG. 2K shows the schematic diagrams depicting several basic types of defects;

DETAILED DESCRIPTION OF THE PREFERRED EMBODIMENTS

Figure 1:
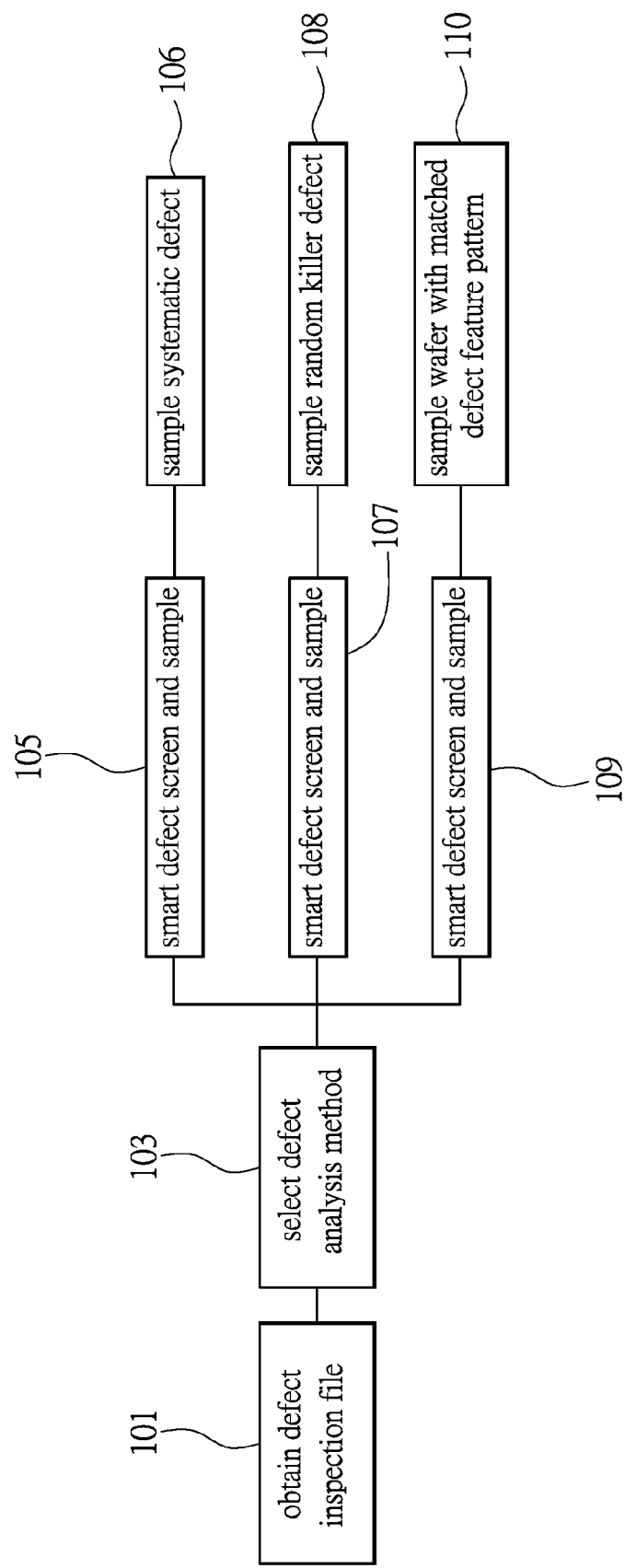
FIG. 1 shows a flow chart depicting a method for intelligent defect classification and sampling and defect pattern recognition according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The design house generally provides a design layout of its IC design to the foundry fab. The Fab utilizes a multitude of equipment to fabricate a lot of duplicated dice according to the design layout on a wafer. During the fabrication, some defects such as random particle defects, process defects, or systematic defects are inevitably generated on the wafer. Therefore, some inspection tools are utilized to scan the wafer and obtain the defects. Then, a defect sampling method is used for finding out the random defects and systematic defects. The further improvement for modifying the design based on the defect information therefore increases the yield.

The semiconductor fabrication process produces the systematic defects that may easily occur over some kinds of design layouts and may result in fatal error. The weak defects may be eliminated effectively when the positions of the defect patterns can be recognized in the beginning of fabrication. The yield may also be increased. The core technology is such as defect sampling and recognition. Disclosure herein is related to a method of intelligent defect classification sampling and pattern recognition, and a computer-readable storage device thereof. The system is based on a software and hardware framework. The method and system are preferably applied to the semiconductor fab such as wafer fab, IC, or process design house.

In one of the embodiments of the present invention, the method for intelligent defect classification and sampling and pattern recognition is applied to a computer-implemented intelligent defect pattern recognition system. In the method, by a computer system, through a defect inspection tool in a fab, defect inspection data may be acquired. Further, a defect pattern recognition engine is introduced for conducting defect signature pattern recognition for the various defect signature patterns and flag the specific identified defect signature pattern wafer.

For the defects found by a bright field inspection tool, which is used to perform scanning in lithography or etching process with design layout patterns, the method in accordance with the present invention is to generate defect patterns after screening out non-killer defects. It is noted that the method for screening out the non-killer defect is referred to the present applicant's U.S. patent application Ser. No. 13/005,932, filed on Jan. 13, 2011, and issued as U.S. Pat. No. 8,312,401 on Nov. 13, 2012, entitled "Method for smart defect screen and sample." That means the new defect pattern is from the remaining killer defects after the screening process. It is noted that the contour of defect pattern can be recognized through a geographic recognition by means an image processing method. For example, the image processing method can be implemented by a series of computer program for scanning the image pixel-by-pixel, and pixel-by-pixel comparison based on the images recorded in a pattern library. Further, the image processing means is used to divide the scanned defect image into multiple areas, image clarification, and scan edge of the defect pattern, and recognize contour of the defect pattern.

According to one of the embodiments of the present invention, the intelligent defect sampling method utilizes the methods such as focus exposure matrix (FEM), process window qualification (PWQ), or a regular defect sampling process to obtain more meaningful defect images. The provision of the mentioned FEM or PWQ can be referred to the U.S. Pat. No. 8,312,401, application Ser. No. 13/005, 932. That means the fab or other manufacturing factory requires fast and intelligent defect pattern sampling tools.

An intelligent defect classification and sampling method in PWQ (process window qualification), FEM (focus exposure matrix), or similar matrix experiments, etc. will make weak pattern verification successful. The sampling is based on its operation occurrence probability.

In fab SPC control (statistical process control), there are 3-sigma (standard deviation) or 6-sigma statistical process control in manufacturing processes. So, the majority of the operation data will fall inside the baseline window. Only partial data will fall outside the baseline window, especially within the one delta parameter shift away from the baseline window. There is little chance for this to happen inside the two or more delta parameter shifts away from the baseline window. Since the probability of two or more delta parameter shifts is low, it is not necessary to select defect samples within the area with the two or more delta parameter shifts. Therefore, in the method of the present invention, the defect sampling will be primarily performed only within the baseline window and the area with the one or two delta parameter shifts from the baseline window.

The defect sampling method is configured to find out the possible systematic defect patterns based on normal distribution probability characteristics, SPC theory and optimal conditions to find out possible systematic defect patterns. Further, an SPC probability index is introduced to sampling based on the meaningful occurrence chance of the weak pattern defect. It is noted that the aforementioned baseline window and its outward zone with one or more delta parameters are determined based on the normal distribution probability characteristics, SPC and the optimal conditions. The normal distribution probability may be referenced in the curve drawn in FIG. 8.

An intelligent defect classification sampling method in PWQ, FEM, or similar matrix experiments, etc. will verify the weak defect patterns. Here a CAA (critical area analysis) sampling index is introduced based on its weak pattern failure probability. Some of the defect layout pattern groups have stronger potential to cause open or short failure. Some defect layout pattern groups with wider layout dimension have less potential to result in open or short failure.

In the method of the present invention, a killer defect index, e.g. referring to the same applicant's U.S. patent application Ser. No. 13/005,932, filed on Jan. 13, 2011, now issued as U.S. Pat. No. 8,312,401, acts as a base to evaluate the CAA sampling index. A CAA sampling index threshold may be defined to gauge the possibility to cause the (1) open, (2) short, (3) overlapping; and (4) poor pattern conductivity failure. It is prone to select a defect sample when this defect layout pattern group's average CAA sampling index is higher than the CAA sampling index threshold. The sampling is accordingly performed. Otherwise, it is recommended not to select any defect sample when this defect layout pattern group's average CAA sampling index is lower than the CAA sampling index threshold. The higher CAA sampling index means the more critical the weak pattern is. Therefore, the sampling method in accordance with the present invention uses the mentioned sampling schemes for the different defect types with a priority order, and the weak pattern defects may be almost found during the defect sampling stage.

FIG. 1 shows a flow chart depicting a method for intelligent defect classification sampling according to an embodiment of the present invention. It is noted that the method is implemented by a series of software modules in a computer system.

In the beginning, such as step 101, the system obtains defect inspection files from the fab after defect inspection has been performed using a defect inspection tool over the specific wafers, one of the devices under test (DUT). Next, in step 103, one of the defect analysis methods is selected to scan the defects over the wafers, such as the aforementioned PQW, FEM, other defect scan method, or a regular defect scan method. The defect analysis is applicable to perform the further micro defect analysis, in particular to get the fatal or non-fatal defects by one-to-one defect pattern comparison. Further, the defect analysis is also adapted to macro defect analysis for analyzing the defect patterns under a wafer scale. The schematic diagram shown in FIGS. 2A through 2G depicts some types of the defect patterns.

From a microcosmic view, the defect analysis method is performed to gain the defect inspection files. The defects such as the systematic defects can be found by the smart defect screen and sample (step 105), which is disclosed in the same applicant's U.S. Pat. No. 8,312,401. After that, the systematic defects are sampled (step 106). The related patterns are such as the images shown in FIGS. 2A through 2B. For example, the systematic fatal defects 201, 202 formed over the circuits may result in the short or open circuits. The open circuit may mean the layout patterns is overlapped by the defects; or the layout patterns, e.g. the via, may cause the poor conductivity.

Further, non-killer defects can be found by the method of smart defect screen and sample disclosed in the same applicant's U.S. Pat. No. 8,312,401 (step S107). Then the random killer defects are found through the intelligent defect classification sampling method of the present invention (step S108). Furthermore, the diagnosis equipment with abnormal incidence may generate the defects found by the defect analysis tool. The defect analysis tool is used to diagnose whether or not the defects formed by the equipment or in the process are generated. However, these kinds of defects may not be classified to be the random fatal defects 203, 204, 205 described in FIGS. 2C through 2E. The automatic defect classification and sampling may be applicable for these situations.

Figure 2G:
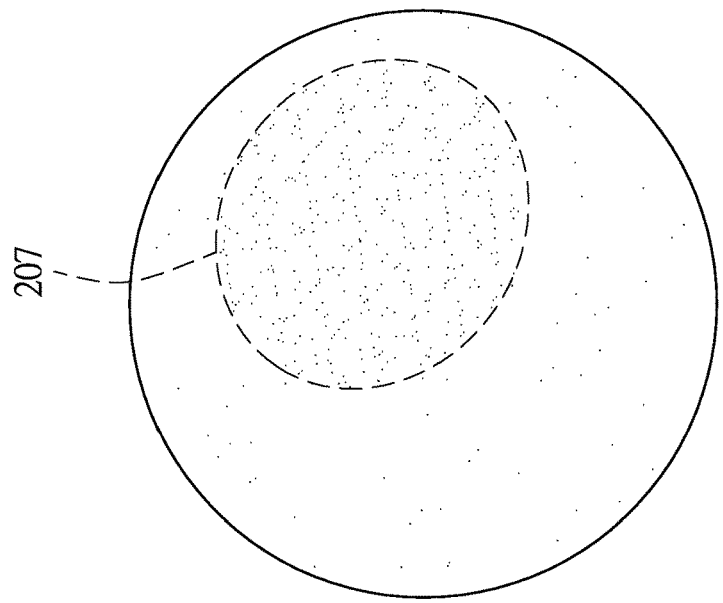
Figure 2F:
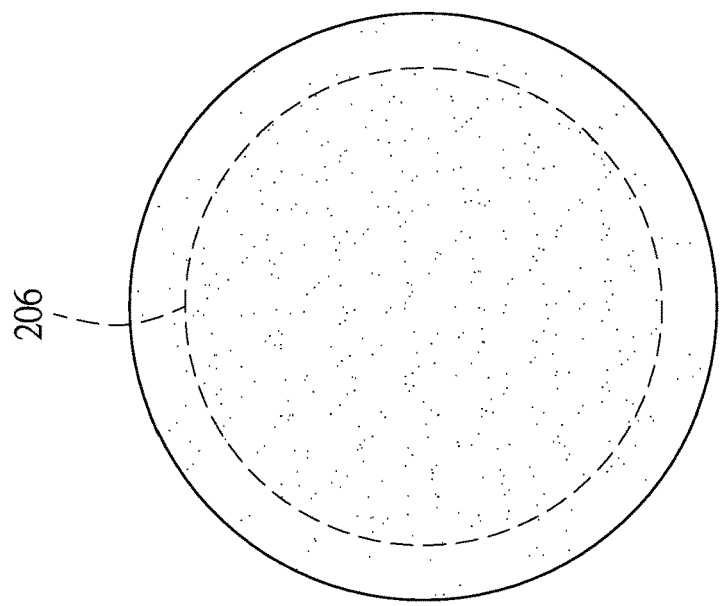
Figure 2E:
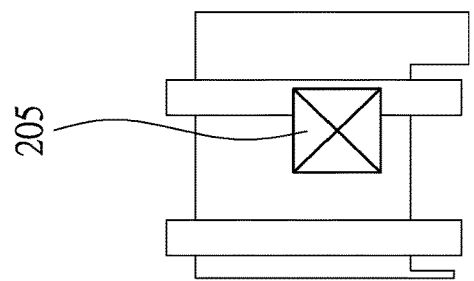

Some other defects as described in step 109 may be the defects formed by equipment malfunction that is diagnosed by the diagnostic tool of the intelligent defect classification sampling system. The defects may be found in the wafermap by the macro defect analysis method. Therefore, a larger range of defect distribution can be obtained by the system from a wafer without any layout pattern. These kinds of defects are primarily formed by the mal-functional equipment. FIGS. 2F and 2G schematically show the defect distribution over a wafermap. FIG. 2F shows a ring shape defect pattern 206. FIG. 2G shows a cluster shape defect pattern 207. Next, in step 110, by the intelligent defect classification sampling method, a software-based dark field defect inspection tool can be used to sample the defects in compliance with the defect signature pattern over the wafer. This inspection acts as a method to diagnose the equipment malfunction.

It is noted that both the dark field defect inspection and the bright field defect inspection are based on a principle of light reflection. When an incident light emitted to the surface of wafer, the tool can inspect the defects through the transmitted light when the light vertically arrives the target, e.g. wafer, or inspect the defects through the reflected light when the incident light arrives the target at a specific incident angle. The bright field defect inspection tool is mainly intended to inspect the systematic defects, and the random defects with pattern levels. The dark field defect inspection is for inspecting the defects caused by the equipment and the manufacturing process.

Figure 2K:
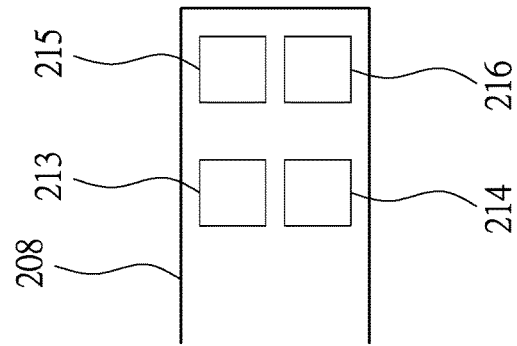
Figure 2J:
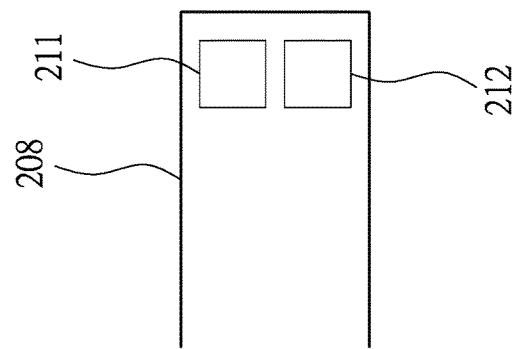
Figure 2I:
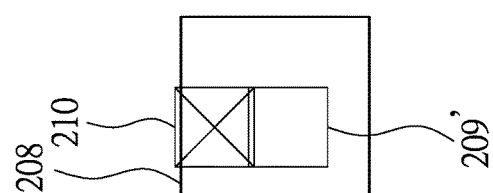
Figure 2H:
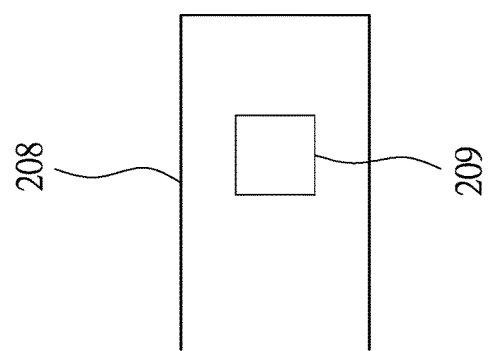

In addition to the open or short circuit failure described in FIGS. 2A through 2D, FIG. 2H further shows the defect patterns over the layout circuit line, such as the defect 209 overlapping the layout pattern line 208. The defect pattern 209 is such as a via that is distanced with a spacing from the border of the line 208. Through the inspection tool, the defect may not be easily formed at the overlapped area of the layout pattern line 208 and the defect pattern 209 because the spacing is wider. For example, the defect pattern 209 and the border of the layout pattern line 208 shown in FIG. 2H may not get too high risk. However, as the situation shown in FIG. 2I, the defect 210 may be formed over the overlapped region of the layout pattern line 208 and the defect pattern 209' since the spacing there-between is too small. The situation shown in FIG. 2I causes higher risk because of the open circuit or the short circuit between the upper and lower circuits.

The risk of the layout patterns in a specific layout is correlated with the number of defects and the spacing. For example, if only one via exists over the layout circuit line, the defects may cause high risk of open or short circuit. The layout with multiple vias can reduce the risk of open or short circuit over the layout lines. For example, the layout pattern shown in FIG. 2J has multiple vias such as the two layout patterns 211, 212. Still further, the line 208 shown in FIG. 2K has several vias 213, 214, 215 and 216 that can effectively reduce the risk of open or short circuit caused by the defects.

Figure 3:
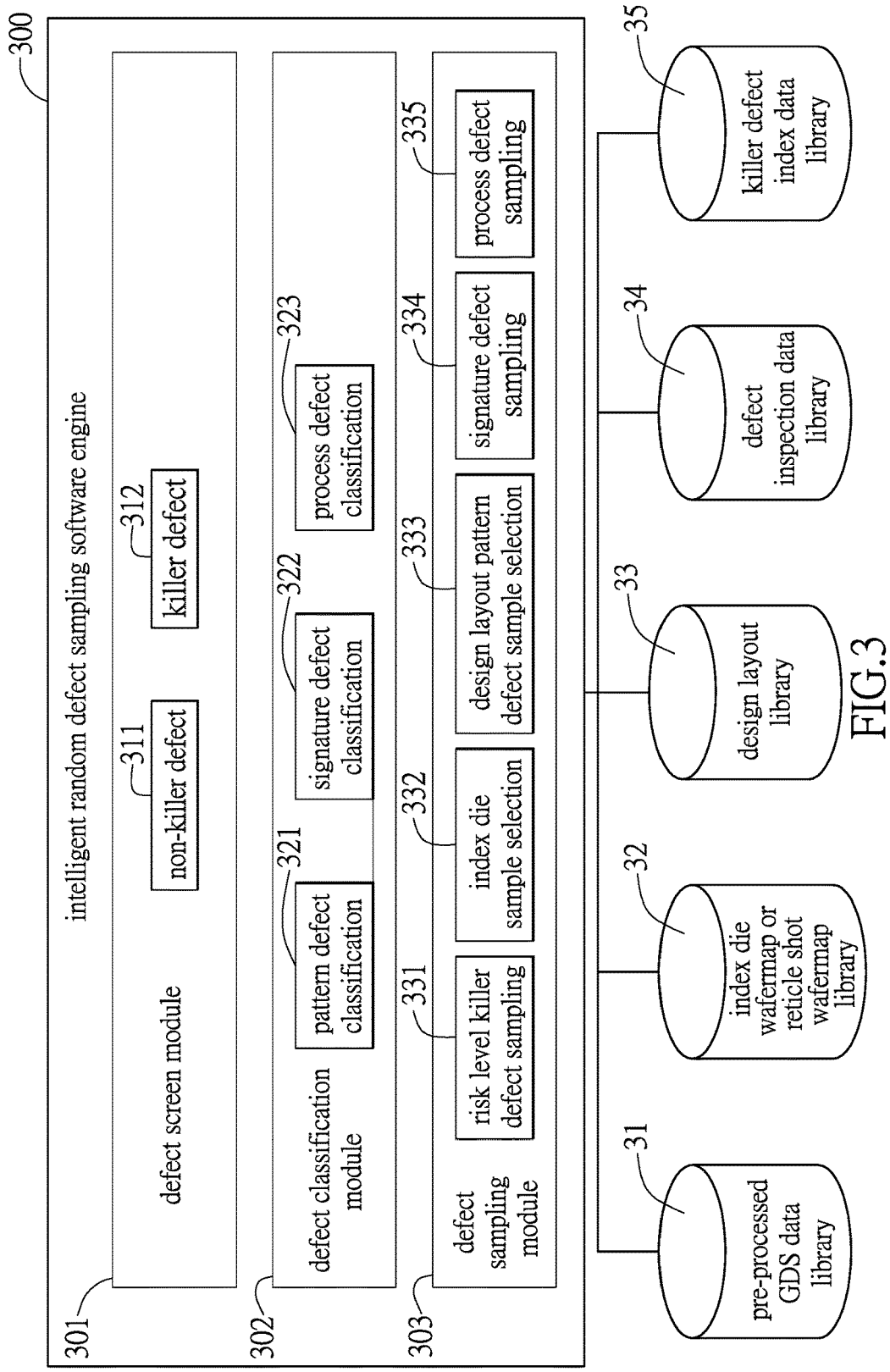
FIG. 3 shows a module diagram depicting a computer-implemented intelligent random defect sampling software engine in one embodiment of the present invention.

FIG. 3 shows a module diagram depicting a computer-implemented intelligent random defect sampling software engine in one embodiment of the present invention. A defect sampling subsystem for handling defect recognition is described. The defect sampling subsystem, implemented by a computer system, embodies an intelligent random defect sampling software engine 300 as the defect sampling subsystem. This software engine 300 may be separated into several software modules according to its functions.

The software modules are such as a defect screen module 301, a defect classification module 302, and a defect sampling module 303. The modules are particularly used to diagnose the mal-functional equipment and the defects in the manufacturing process as described in step 108 of FIG. 1.

The defect screen module 301 embodies the technology to screen out the non-killer defect 311 and killer defect 312. The defect screen module 301 employs a screen threshold. The killer defect is found when it is larger than the threshold; and the non-killer defect is smaller than the threshold. Reference is made to a U.S. Pat. No. 8,312,401, filed on Jan. 13, 2011 with application Ser. No. 13/005,932, by the same applicant as the present application. A killer defect index is defined based on layout based defect pattern groups, acting as a threshold for screening out the non-killer defects such as dummy defects, and a kind of nuisance defects. The mentioned index threshold is referred to determine the killer defect pattern type of the defect patterns, including the high risk killer defect with higher killer defect index that may easily cause die failure; and the low risk killer defect with lower killer defect index that may not easily cause the die failure. Therefore, through this scheme, the high and low risk killer defect can be determined, and even the non-killer defects. The non-killer defects are such as dummy defects and nuisance defects.

The defect classification module 302 is used to perform pattern defect classification (321), including acquiring the defect patterns within a memory cell area and its peripheral circuit layout area. The defects may also be the defects formed over component, such as within the NMOS layout area, PMOS layout area, and vertical and horizontal polygon layout area. Furthermore, some special defect patterns may be produced over the structure such as t Silicon-germanium (SiGe), FinFET, and high-k metal gate. In the process of classification, a defect coordinates transformation is used to compare with the well-defined defect patterns; and the layer of the defects can be found.

The mentioned die area is the area where the die is formed. The die is such as the die of SRAM, DRAM, or Flash memory. The die occupies a unit area after the wafer dicing.

The defect classification module 302 performs signature defect classification 322. The defect classification method may be referred to in U.S. Pat. No. 8,312,401, by the same applicant with the present application. The sampling scheme is applied to acquire the signature patterns of the device under test such as line-shaped, cluster-shaped, and donut-shaped patterns. The signature pattern can be sampled from a mask defect and wafermap signature pattern defect. One of the methods of comparison is to compare with a wafer defect diagram for determining if it is matched with the signature pattern library. The detail of the screening scheme can be referred to the technology described in the same applicant's U.S. Pat. No. 8,312,401.

The defect classification module 302 can also be used to classify the defects produced in the manufacturing process (323), by which this classification process can acquire previous layer's defect, random particle defect, and residue defect. Because the process defects should be produced in every layer of the product in the manufacturing process, one of the methods is to determine if the defect coordinates in the current layer is complied with the defect coordinates in the previous layer by comparing with the defect coordinates among the layers. Therefore, the comparison and classification can find out the process defects.

To find out the random defects in the manufacturing process, one of the methods is to determine if the defects are not the signature defects, or are the defects in the previous layer. When the defects are determined not the signature features or not the defects in the previous layer, they are random defects.

The defect sampling module 303 adopts some software modules as follows. The software modules are such as shown risk-level killer defect sampling (331), an index die sample selection (332), a design layout pattern defect sample selection (333), a signature defect sampling (334), and a process defect sampling (335).

The aforementioned killer defect index analysis can be referred to the description of the same applicant's issued U.S. Pat. No. 8,312,401, titled "Method For Smart Defect Screen And Sample", and R.O.C. Taiwan Patent No. 1402928, titled "intelligent defect screen and sample method." Through the killer defect index (KDI) analysis, sample high and to low risk killer defects are sampled according to risk level by risk-level killer defect sampling (331). The killer defect index analysis allows the system to recognize the defects being categorized into high risk killer defects, medium risk killer defects, low risk killer defects, and negligible risk killer defect. For example, the probability of die failure is extremely high when the risk approaches 1; the defects are determined to be non-killer defects when the risk is equal to 0 or approaches 0. The non-killer defects are such as dummy defects, or nuisance defects. The risk can be denoted by killer defect index (KDI). The killer defect index can be evaluated by numeral 0 to 1. An index threshold can be incorporated to determine the indication of the types of killer defect patterns.

The index die sample selection (332) is primarily based on a selection rule, e.g. a predetermined priority, that directs the wafermap to be defect sampled. Another function of design layout pattern defect sample selection (333) is to perform selection sampling onto the layout pattern obtained from design house. After the sample of wafermap and the design layout are selected, a function of signature defect sampling (334) is performed to the defects of the wafermap, and also to the defects produced in the manufacturing process and by the equipment, that are made by the function of process defect sampling (335).

The subsystem of the engine 300 includes various libraries. A pre-processed data library, or pre-processed GDS data library, 31 is used to store the design files including patterns. An index die wafermap or reticle shot wafermap library 32 is used to record the images of device under test such as a wafer. A design layout library 33 is used to store the layout diagrams from the design house. A defect inspection data library 34 is used to record the defect inspection data from the wafer Fab or manufacture plant. A killer defect index data library 35 is used to record the various killer defect indexes.

Figure 4:
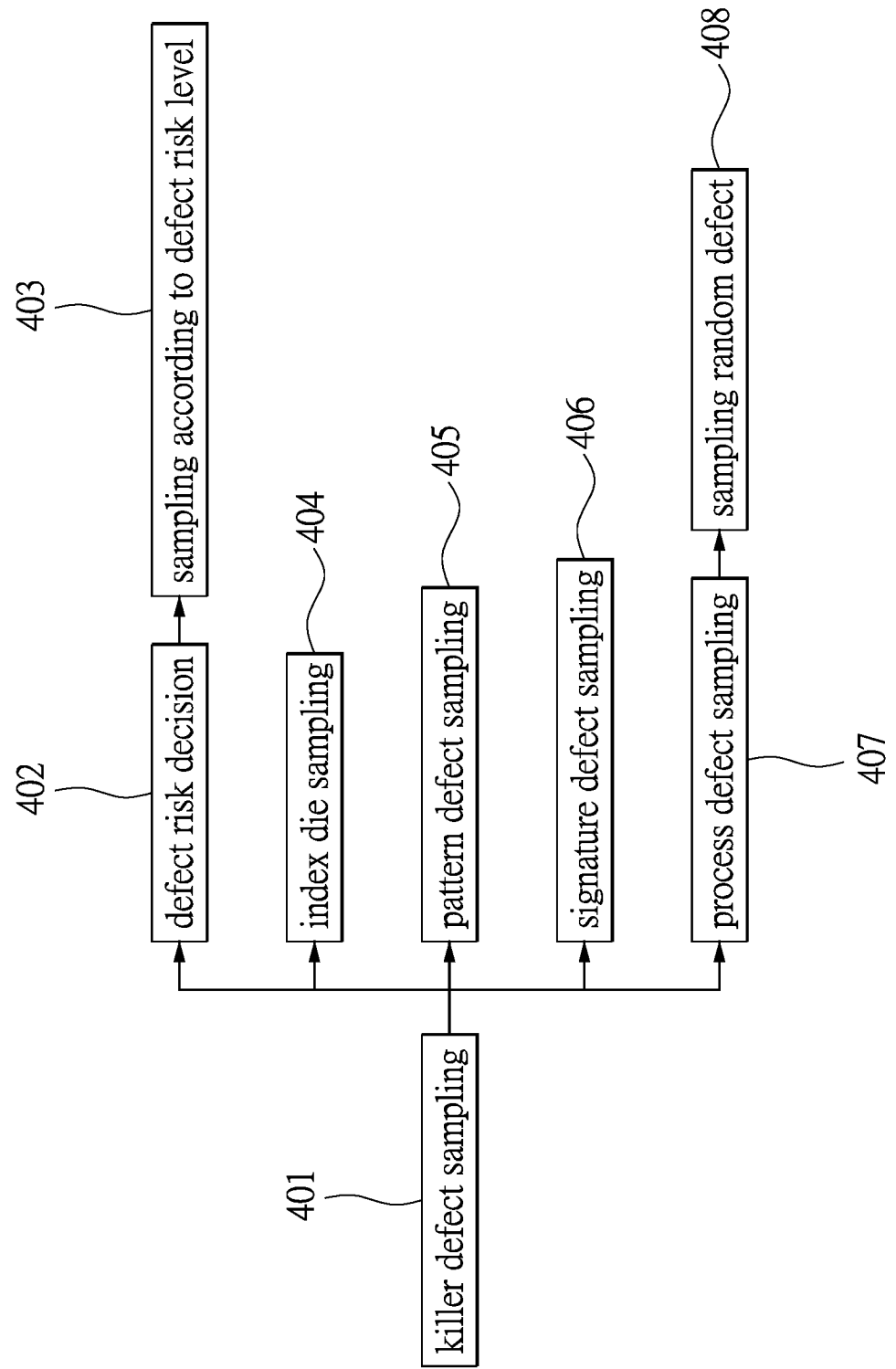
FIG. 4 shows a flow chart depicting random vital defect sampling process in the method of the present invention.

After the process of defect classification, the system samples the killer defects, as the flow chart describing the process of random killer defect sampling shown in FIG. 4.

In step 401, killer defect sampling is performed, in which a killer defect index (KDI) is incorporated to determine defect risk, as shown in step 402. In step 403, in accordance with a predefined risk-level/defect risk level, the sampling is performed. In an exemplary example, in one embodiment, the system may get more samples with high risk killer defects; less samples with medium risk killer defects are found; least sample with low risk killer defects; and almost needs not sample the samples with negligible risk killer defects, or sample few samples for this type of defects.

Next, in step 404, the system samples the index dies. The range of sampling may be based on the index die distribution over the wafermap, and a priority of sampling the high-risk defects, signature defects, the well-defined pattern defects, and the process defects.

In step 405, the system samples the well-defined pattern defects including the most defect patterns. The system may also follow the priority to perform the sampling.

In step 406, the system samples signature defects including some mask defects, and wafermap signature pattern defects.

In step 407, the system samples the process defects, in particular to sample the defects in the previous layer, especially to some representative defects thereon. Further, as in step 408, the system may randomly sample the process defects after a comparison process.

Figure 5:
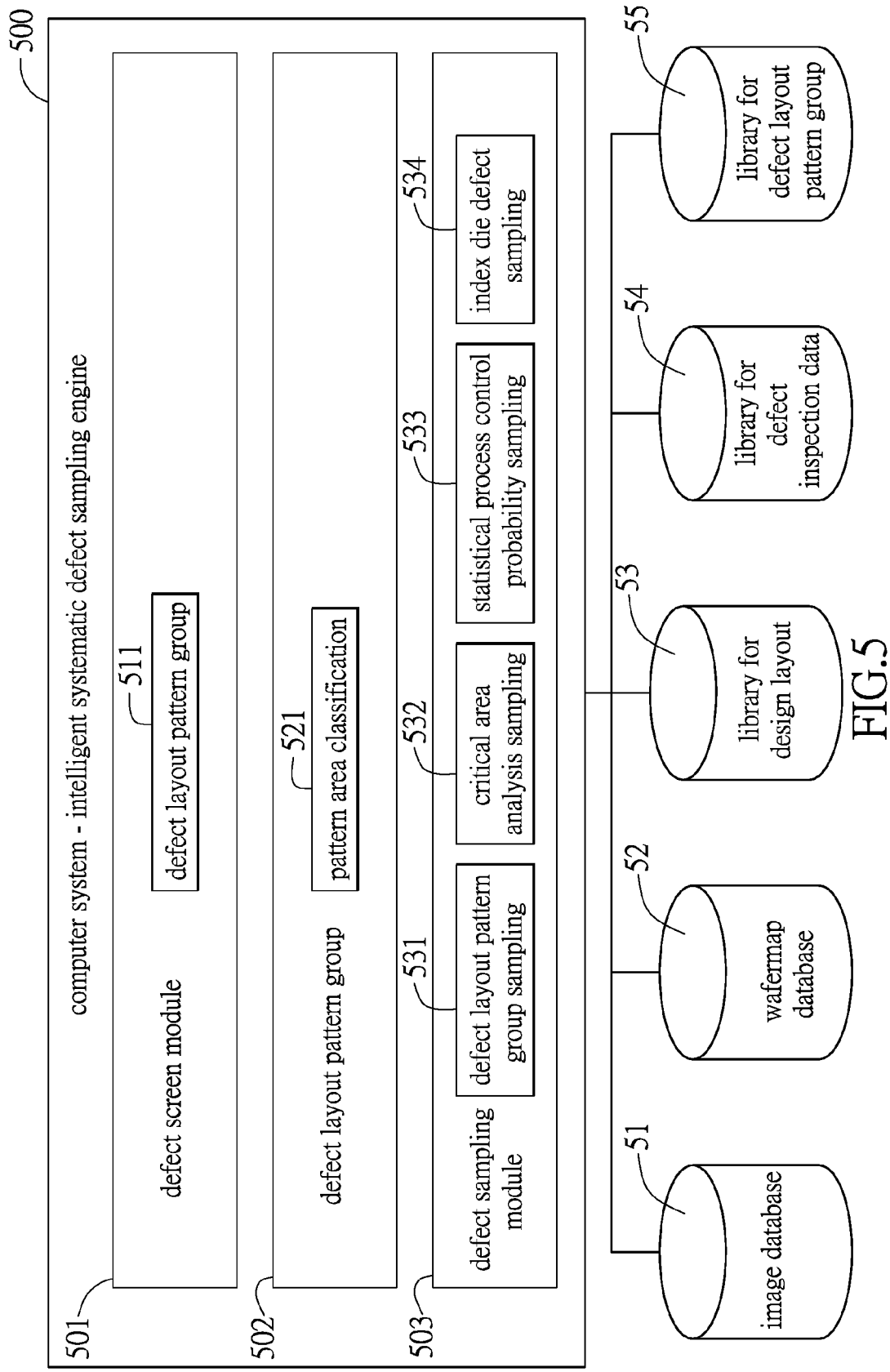
FIG. 5 shows a module diagram depicting a computer-implemented intelligent defect sampling software engine in one embodiment of the present invention.

The computer-implemented function modules of the intelligent systematic defect sampling software engine are described in FIG. 5.

FIG. 5 shows a hardware or software-implemented intelligent systematic defect sampling engine 500. In which, a defect screen module 501 utilized to perform defect screening, classification, and sampling; a defect classification module 502; and a defect sampling module 503 are included. These modules are used to perform diagnosis of the systematic defect patterns and the layout, as described in step 106 of FIG. 1.

The defect screen module 501 performs defect screening, and creates defect layout pattern group (511). The related process can be referred to the same applicant's U.S. Pat. No. 8,312,401, that is titled "Method for smart defect screen and sample."

The defect classification module 502 performs pattern area classification (521) upon the defect layout patterns. Through the pattern area classification (521), a comparison is processed to have the defect layout pattern groups for memory cell area, and defect layout pattern groups for the peripheral circuit layout area.

The defect sampling module 503 continuously samples the classified defect layout pattern groups (531). In one embodiment, a Pareto chart distribution is incorporated to process sampling for the defect layout pattern groups, e.g. mostly sample the groups having high defect probability, but less sample the groups having lower defect probability.

In one embodiment, the defect sampling module 503 introduces a critical area analysis (CAA) sampling index which is based on a failure probability of the weak patterns. CAA sampling index is an index for killer defects by which to perform sampling (532) upon the defect layout pattern groups that may result in open or short failure. In one embodiment, the system can obtain the weak defect pattern through a sampling method when the defect layout pattern group's average critical area analysis sampling index is larger than a threshold.

A SPC (statistical process control) probability index (533) can be introduced, and used to define a defect sampling baseline window according to defect probability. The SPC (statistical process control) probability index (533) can be employed to sample the range having high defect probability. Further, the defect sampling module 503 performs index die defect sampling (534) for deciding the wafermap to be defect sampled.

The libraries of the intelligent systematic defect sampling engine 500 are described as follows.

An image database 51 is used to store the design pattern/diagram files, such as the images produced by GDS (graphic database system) from IC design house. The image database 51 also records information of geographic patterns, texts, tags, and design layouts that can be used to reproduce the layout of layers of IC. The contour of defect pattern can be recognized through a geographic recognition by means an image processing method. For example, the image processing method can be implemented by a series of computer program for scanning the image pixel-by-pixel, and pixel-by-pixel comparison based on the images recorded in a pattern library. Further, the image processing means is used to divide the scanned defect image into multiple areas, image clarification, and scan edge of the defect pattern, and recognize contour of the defect pattern.

The intelligent systematic defect sampling engine 500 has a wafermap database 52 which stores the wafermaps to be tested, and wafermaps of index dies. The wafermap database 52 is particularly based on the samples undergoing the processes such as FEM, PWQ, or regular defect sampling process. The wafermap database 52 provides inspection data for the defect sampling process.

The intelligent systematic defect sampling engine 500 has a library for design layout from design house 53 and the inspection data made by an inspection tool from the manufacturing plant or wafer fab. The inspection data is stored to a library for defect inspection data from Fab 54.

The defect layout patterns can be obtained from a library for defect layout pattern group 55. Besides the defect layout pattern groups, the library 55 further stores the killer defect index (KDI) for defining the defect risk and the SPC probability indexes. The SPC probability configures a defect sampling range for the operation made by the defect classification module 502, as described in flow of FIG. 6.

In the beginning, such as step 601, the process of defect screening (501) creates the layout pattern groups, as described in U.S. Pat. No. 8,312,401. The defect classification module further acquires the defect layout pattern groups. In step 602, a software means is used to define new pattern layout area. For example, an image processing scheme can be employed in the system for selecting several layers of the wafermap, and forming the new pattern layout areas.

These newly-defined pattern layout areas are such as the memory cell layout area, the peripheral circuit layout area, NMOS layout area, PMOS layout area, and vertical and horizontal polygon layout area. The defects may also be the defects formed over component, such as, but not limited to, within the NMOS layout area, PMOS layout area, vertical and horizontal polygon layout area, and/or FinFET layout area.

After that, such as in step 603, the newly-defined defect layout areas are classified to acquire the systematic defect layout pattern groups, including the memory cell area defect layout pattern group, peripheral circuit area defect layout pattern group, NMOS defect layout pattern group, PMOS area defect layout pattern group, vertical polygon area defect layout pattern group, horizontal polygon area defect layout pattern group, and FinFET area defect layout pattern group.

Figure 7:
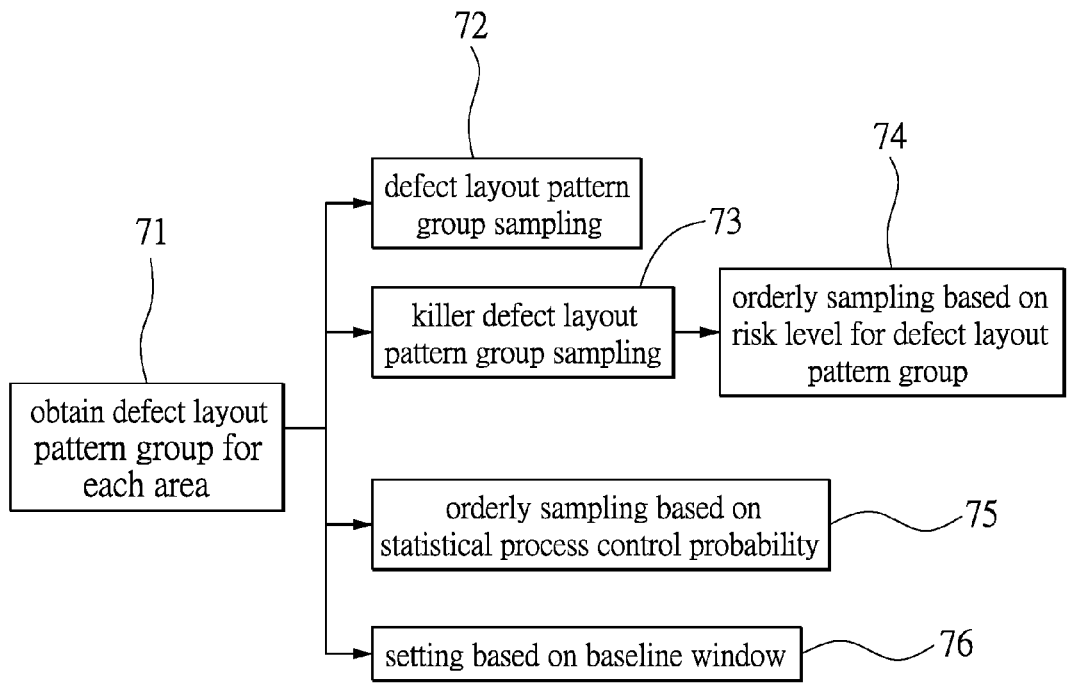
FIG. 7 shows a flow chart describing the intelligent systematic defect sampling process in one embodiment of the present invention.

The systematic defect sampling performed by the defect sampling module (503) can be referred to the flow described in FIG. 7.

Figure 6:
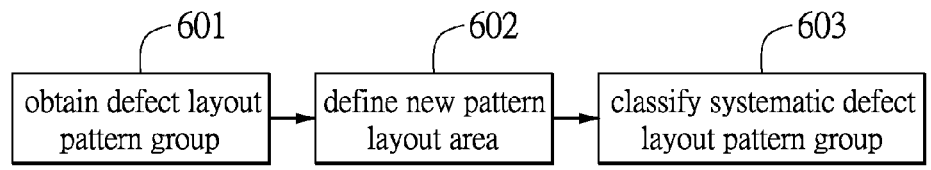
FIG. 6 shows a diagram of functional modules of the intelligent systematic defect sampling engine in one embodiment of the present invention.

In the beginning, in step 71, the aforementioned defect layout pattern groups within the various areas can be obtained as described in FIG. 6.

The process of sampling the systematic defects includes step 72, that is to sample the defect layout pattern groups. A threshold is defined. According to Pareto chart distribution, the system samples the defect layout pattern group when the defect probability is larger than the threshold. The system then classifies the various types of defect layout pattern groups. The groups can be classified as the mentioned memory cell area defect layout pattern group, peripheral circuit area defect layout pattern group, NMOS defect layout pattern group, PMOS area defect layout pattern group, vertical polygon area defect layout pattern group, horizontal polygon area defect layout pattern group, and FinFET area defect layout pattern group.

Step 73 is performed upon the systematic killer defects by introducing killer defect index (KDI), assessing the KDI of the defect layout pattern group, and accordingly sampling from high killer defect index to low killer defect index. In step 74, the system acquires order and quantity of the defect layout pattern groups according to a risk level, and then samples the defects from the defect layout pattern groups with high killer defect index to the low killer defect index.

The systematic killer defects are sampled as described in step 75. The SPC possibility is referred to determine the priority of the defect sampling. A baseline window is referred to divide the defects with the high SPC or low SPC. The most operation data acquired by the system can be sampled within the ranges of several probabilities based on the baseline window. Several sigma ranges can be added based on the baseline window, and configured to be the high SPC probability area, and the low SPC probability area outside the high SPC probability area can also be defined. Thus, the systematic defects can be sampled in accordance with the division of high and low SPC probability areas.

In step 76, the baseline window, and extra added sigma ranges are defined over the wafermap. The index die sampling is performed based on this configuration, and most of the index dies can be obtained within the selected area, and less from the outside area.

Figure 8:
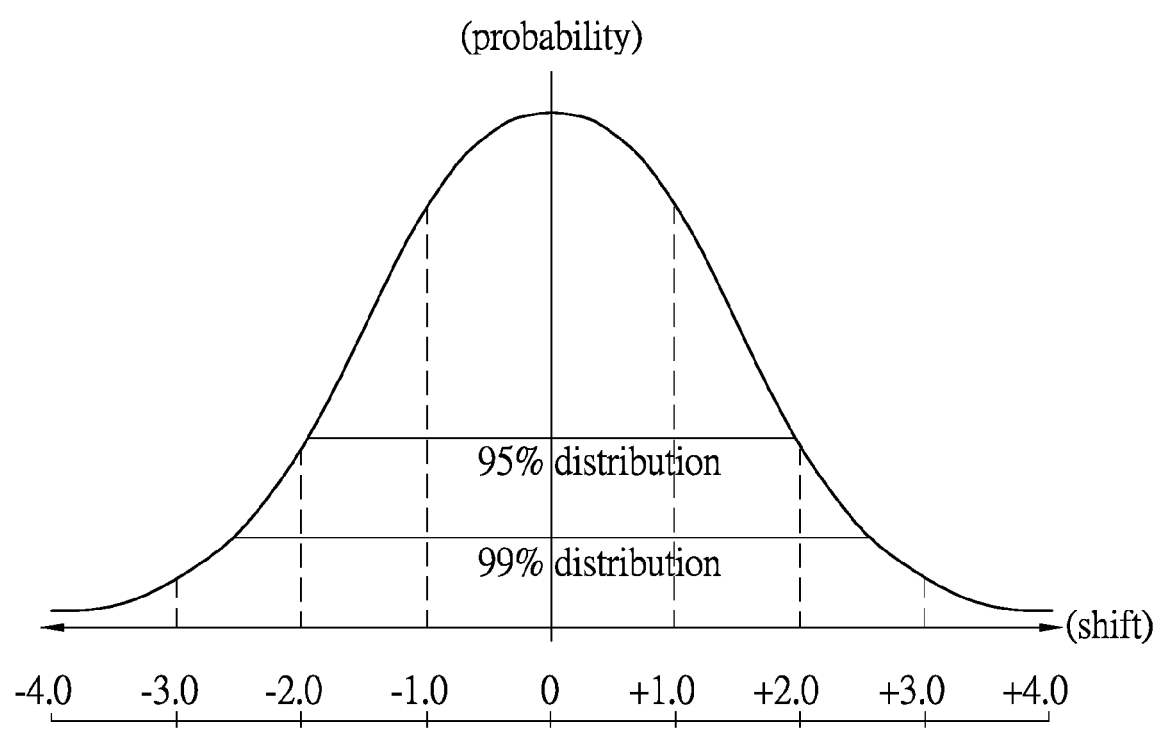
FIG. 8 shows a diagram illustrating distribution of statistical process control possibility in the system.

FIG. 8 shows a diagram illustrating distribution of statistical process control (SPC) possibility in the system. The SPC probability index acts as a reference to define a baseline window for sampling defects. The distribution of SPC possibility is such as a Gaussian distribution shown in the diagram. The vertical axis indicates probability, and the horizontal axis represents a value shift from a center. For example, most of the operation data can be sampled within the baseline window. The baseline window may be set within a range of possibility of 95%. A certain shift range may be set extended outward to the range of possibility of 99%.

Figure 9:
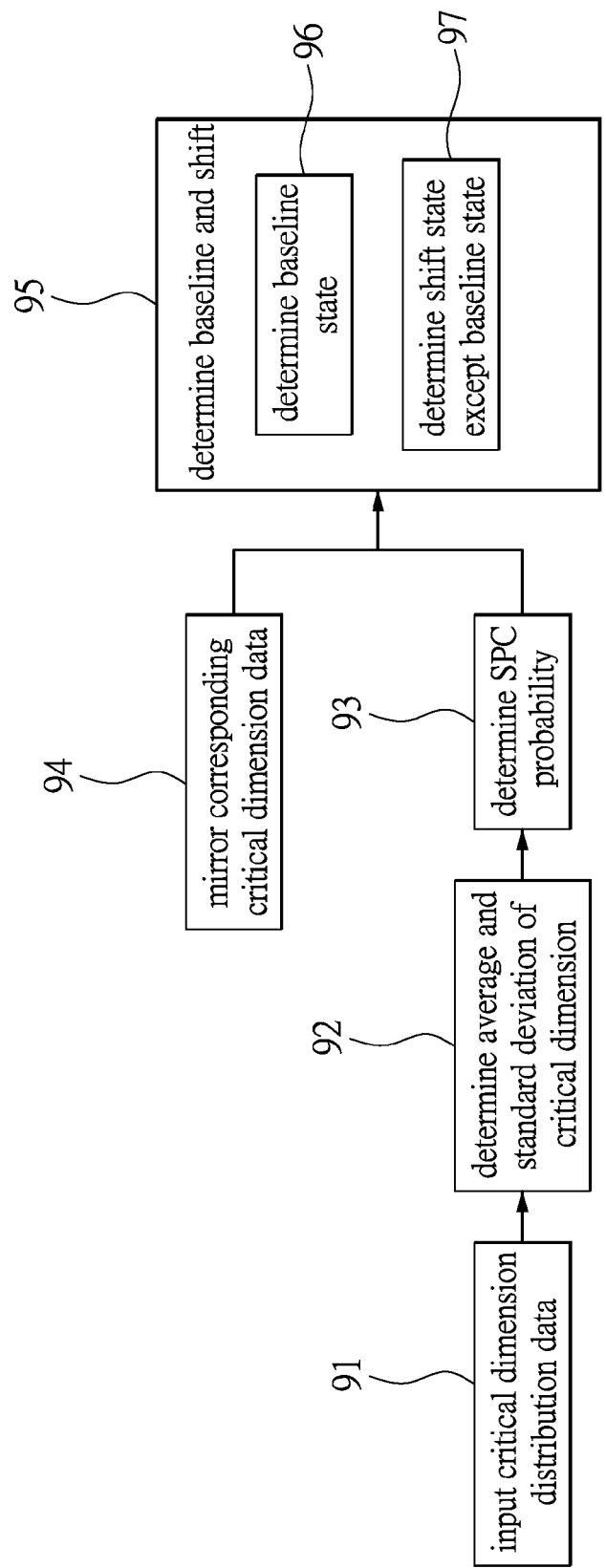
FIG. 9 shows a flow chart depicting determination of baseline window and shift condition in the method of the present invention.

FIG. 9 shows a flow chart depicting determination of baseline window and shift conditions in the method of the present invention.

Such as in step 91, the system firstly inputs data of Critical Dimension Distribution, and determines mean and sigma of critical dimension within the distribution, such as in step 92.

According to the distribution exemplarily shown in FIG. 8, the method goes on defining a sampling range such as the baseline window added some displacement such as 2-3 sigma. Then a SPC probability is determined, such as in step S93. Furthermore, some software tools such as the mentioned FEM and/or PWQ can be configured to have the critical dimension data. In step 94, the SPC probability maps to corresponding critical dimension data. The system therefore obtains the defect inspection data through the sampling range and the probability index in the defect sampling process. Accordingly, the system is therefore determining baseline and shift conditions, such as in step 95, and determines baseline conditions, such as the data within the baseline window, such as in step 96. The baseline window shift condition is also determined, such as in step 97.

The mentioned technology of defining the baseline window and the sigma is based on the critical dimension distribution, in which it is an important step to control the critical dimension (CD) for the lithography process especially the die size on the wafer is getting small in the modern technology. The better critical dimension control can increase the yield since the characteristics of the die and the manufacturing process can be improved.

Figure 10:
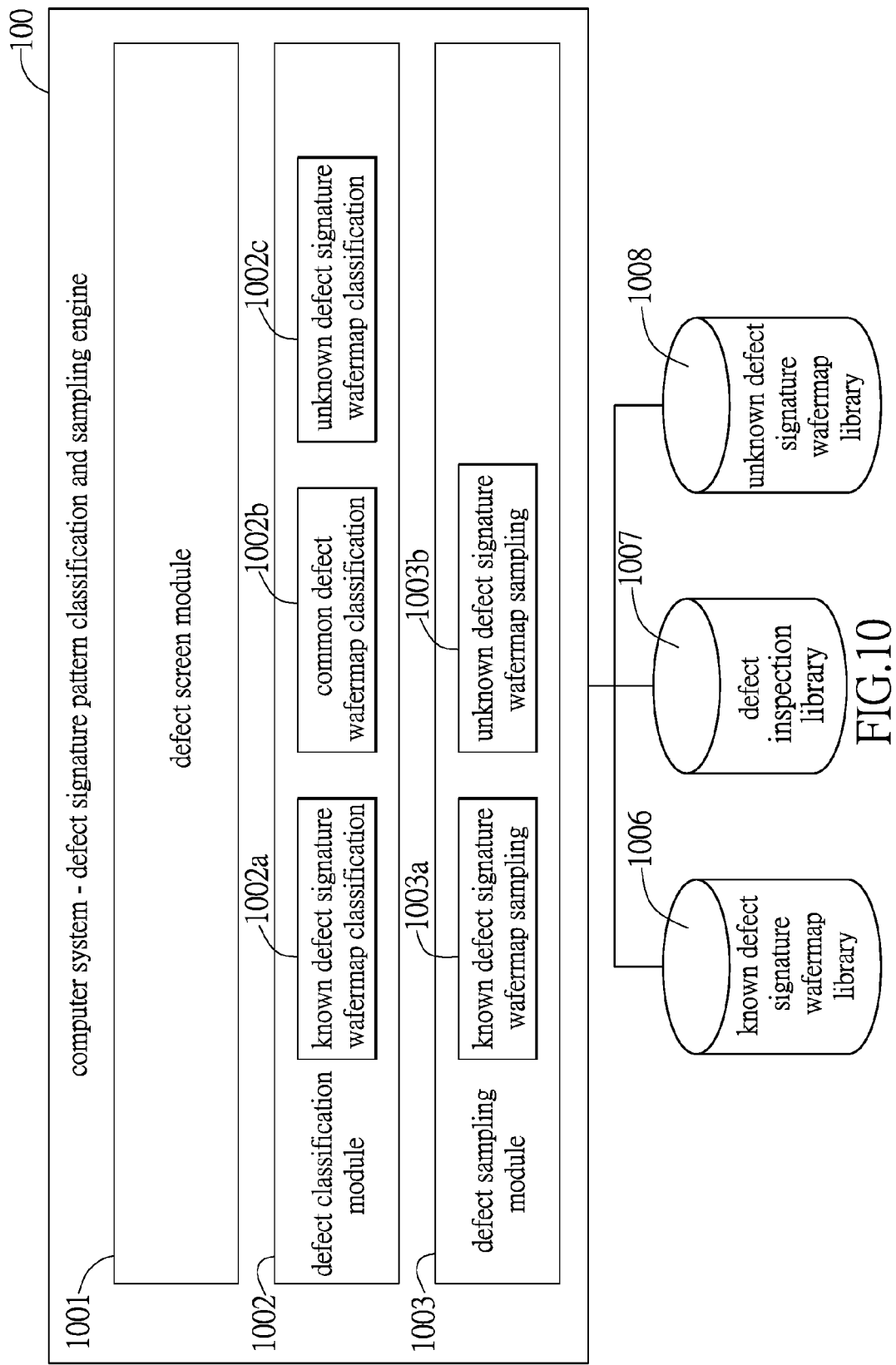
FIG. 10 shows software modules that implement a defect signature patterns classification and sampling engine according to one embodiment of the present invention.

In FIG. 10, several software modules embody the computer-implemented defect signature pattern classification and sampling engine 100. The software modules are such as a defect screen module 1001, a defect classification module 1002, and a defect sampling module 1003. The defect sampling module 1003 implements the functions such as a known defect signature wafermap sampling (1003a) and unknown defect signature wafermap sampling (1003b) that are particularly used to diagnose the mal-functional equipment described in step 110 of FIG. 1.

The software modules are used to perform random defect classification and sampling based on the defect data from several libraries of the system. For example, the system acquires defect data from a known defect signature wafermap library 1006, a defect inspection library 1007, and a unknown defect signature wafermap library 1008. It is noted that the defect inspection tool in the manufacturing plant acquires the defect inspection data that is used to establish the defect inspection library 1007, and the unknown defect signature wafermap library 1008. The defect classification module 1002 embodies the functions such as known defect signature wafermap classification (1002a), common defect wafermap classification (1002b), and unknown defect signature wafermap classification (1002c).

In one of the embodiments for implementing the defect signature pattern classification and sampling engine, the system prepares a computer-readable storage medium/device that stores the software modules performing the intelligent defect classification sampling. The software modules indicate the functions executed in a computer system. The system therefore performs sampling based on a critical area analysis of failure probability of weak pattern so as to obtain the weak defect patterns including the defect layout pattern groups resulting in the open or short circuits.

One of the software modules is a defect screen module (1001, FIG. 10) that is configured to have a killer defect index that is referred to determine the killer defect pattern types of the defect patterns of the object to be tested; a defect classification module (1002, FIG. 10) that is used to classify the pattern defects; and a defect sampling module (1003, FIG. 10) that is used to perform risk-level killer defect sampling according to a risk-level for having the high and low risk killer defects. An index die sample selection is also executed to decide the wafermap to be defect sampled according to a priority. A design layout pattern defect sample selection is executed to conduct the selection sampling to the layout pattern data obtained from design house. Further, the system also samples the defects over the wafermap in the manufacturing process and equipment by signature defect sampling and process defect sampling.

Furthermore, the defect signature pattern classification and sampling engine of system has a web-based interface module. The web-based interface module implements a web browser executed in the computer system. Through the web browser, the system initiates a user interface provided for the user to conduct the intelligent defect classification and sampling. The web interface module initiates a defect analysis graphical user interface including a display area used to display a plurality of wafer defect patterns ($g_1$, $g_2$, $g_n$), and a plurality of selection buttons (111, 112, 113) for performing defect analysis. It is noted that every wafer defect pattern belongs to a specific defect pattern group.

Figure 11:
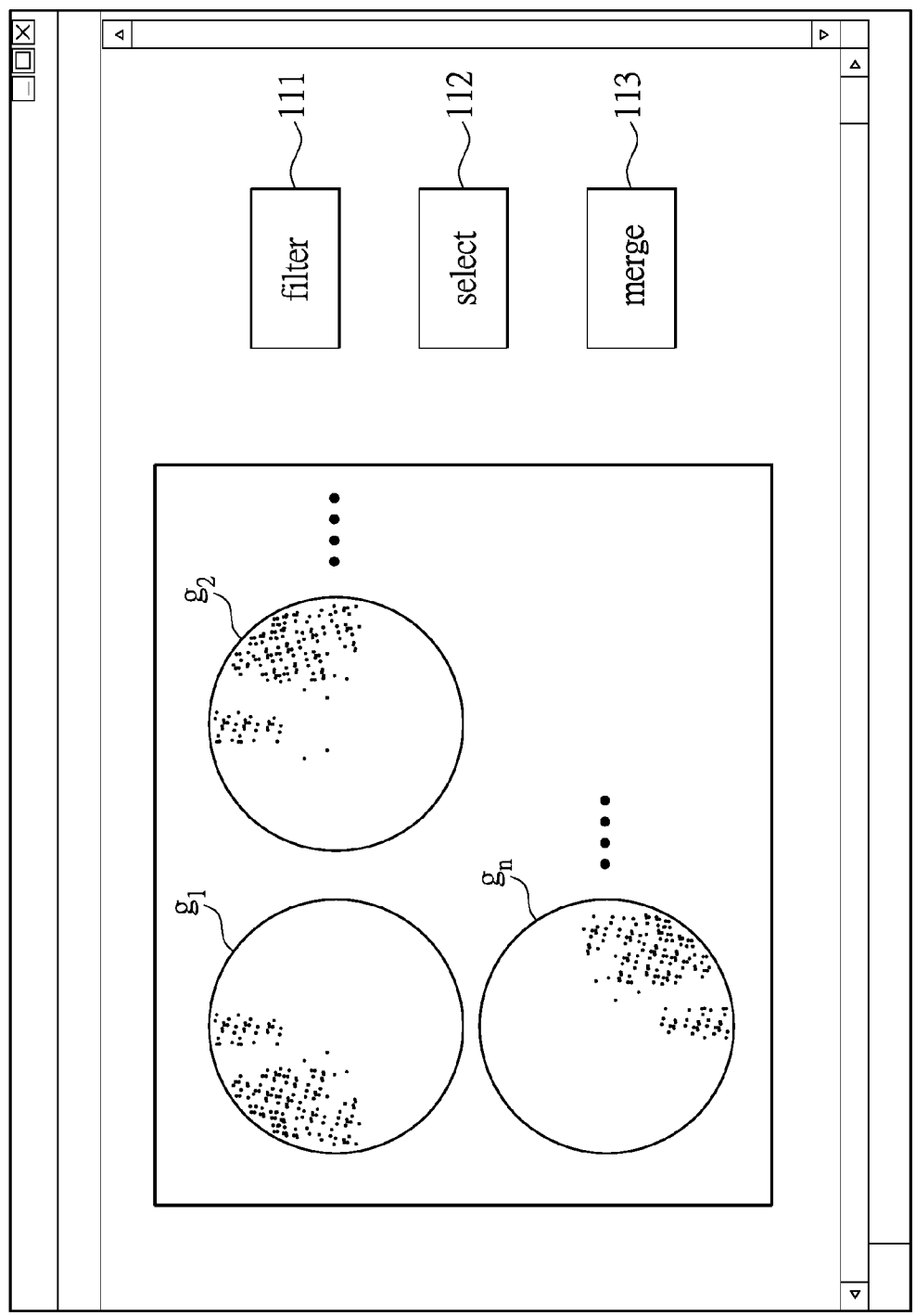
FIGS. 11 through 13 show the user interface for implementing the intelligent defect classification and sampling in one embodiment of the present invention.

FIG. 11 schematically shows the user interface.

A terminal browsing system is shown in the diagram. The browsing system is a computer-implemented defect analysis graphical user interface (GUI), e.g. a web page or the GUI initiated by specific software. A server system also embodies a GUI management. The terminal computer includes a computer system, a touch panel, and storage device.

In the embodiment, the display area is used to display the acquired known and unknown defect patterns. The exemplary example shows several wafer defect map ($g_1$, $g_2$, $g_n$). One side of the user interface shown in the diagram shows several software-enabled pictorial buttons including a filter button 111, a selection button 112, and a merge button 113.

The function in filter button 111 is launched through the defect screen module (301, FIG. 3) for performing defect screening, e.g. filtering the defects, defect patterns, defect wafermaps, and defect pattern groups. The merge button 113 is launched to merge the similar defects that are classified to different groups. The selection button 112 is launched to conduct the function of selecting one of defect pattern groups. The functions made by defect sampling module (303, FIG. 3) are activated through the mentioned buttons.

The system allows the user to browse the defect patterns or the defect pattern groups through the computer screen, and possibly determine the defect pattern groups that may not cause the killer defects or the systematic defects. The user can utilize a computer mouse or his finger over the touch panel to click the filter button 111 that is exemplarily a software-implemented computer icon. The filter button 111 is launched to perform defect screening. The user can click the selection button 112 to perform selection sampling.

Further, the user can click the merge button 113 to merge the similar or the same defects that may be separated to different groups because they are formed at different positions, and the selected defects can be merged to one group. The software-enabled merge button 113 is provided to merge the defects with similar defect pattern from different defect pattern groups.

In one further embodiment, the user can determine if any defect within the baseline window can possibly be the systematic defect when the user browse the wafermap defect distribution of the defect groups through the computer screen. The user can click the filter button 111 using the computer mouse or through the touch panel for performing filtering, or click the selection button 112 to make a selection.

Figure 12:
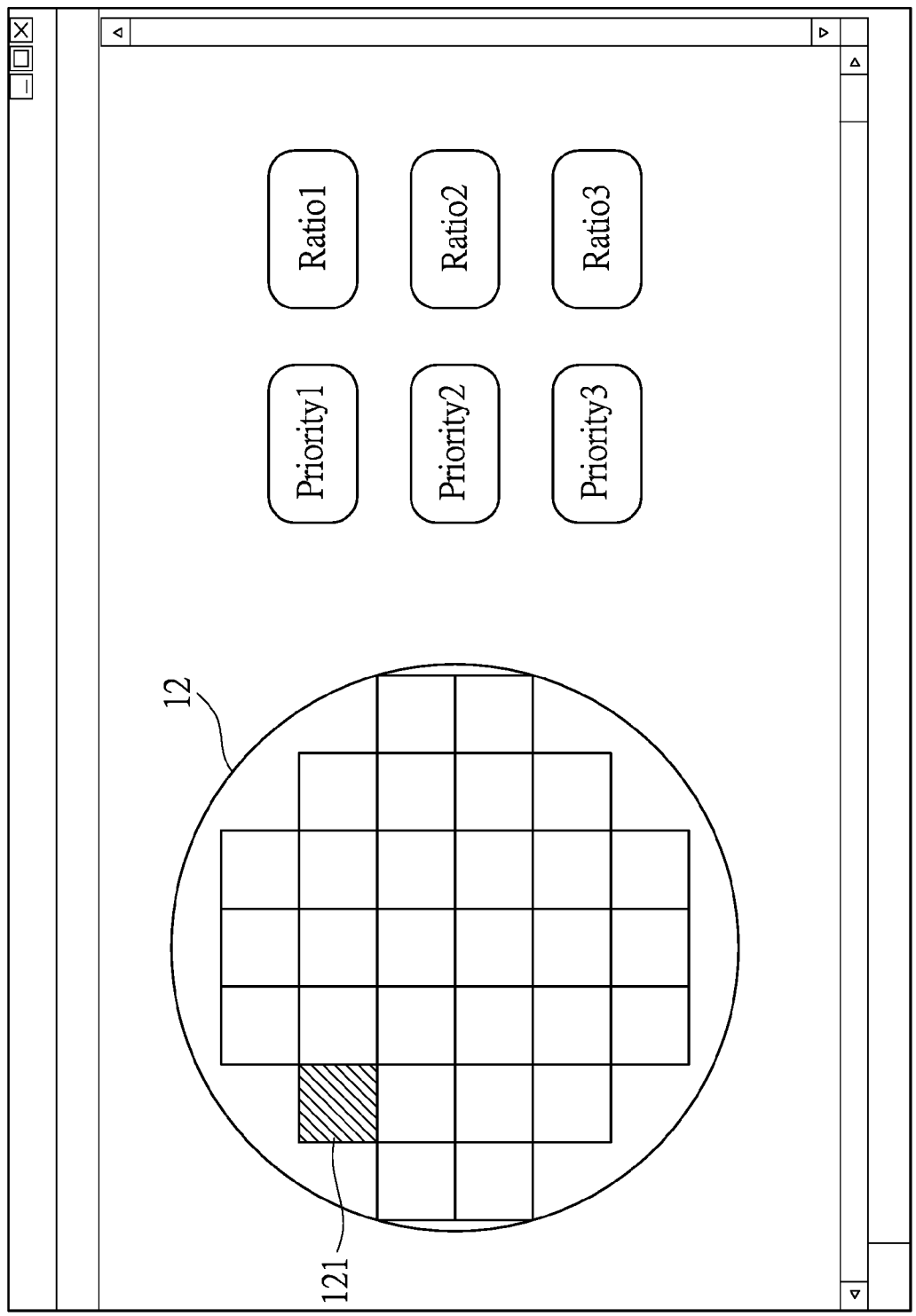
Figure 13:
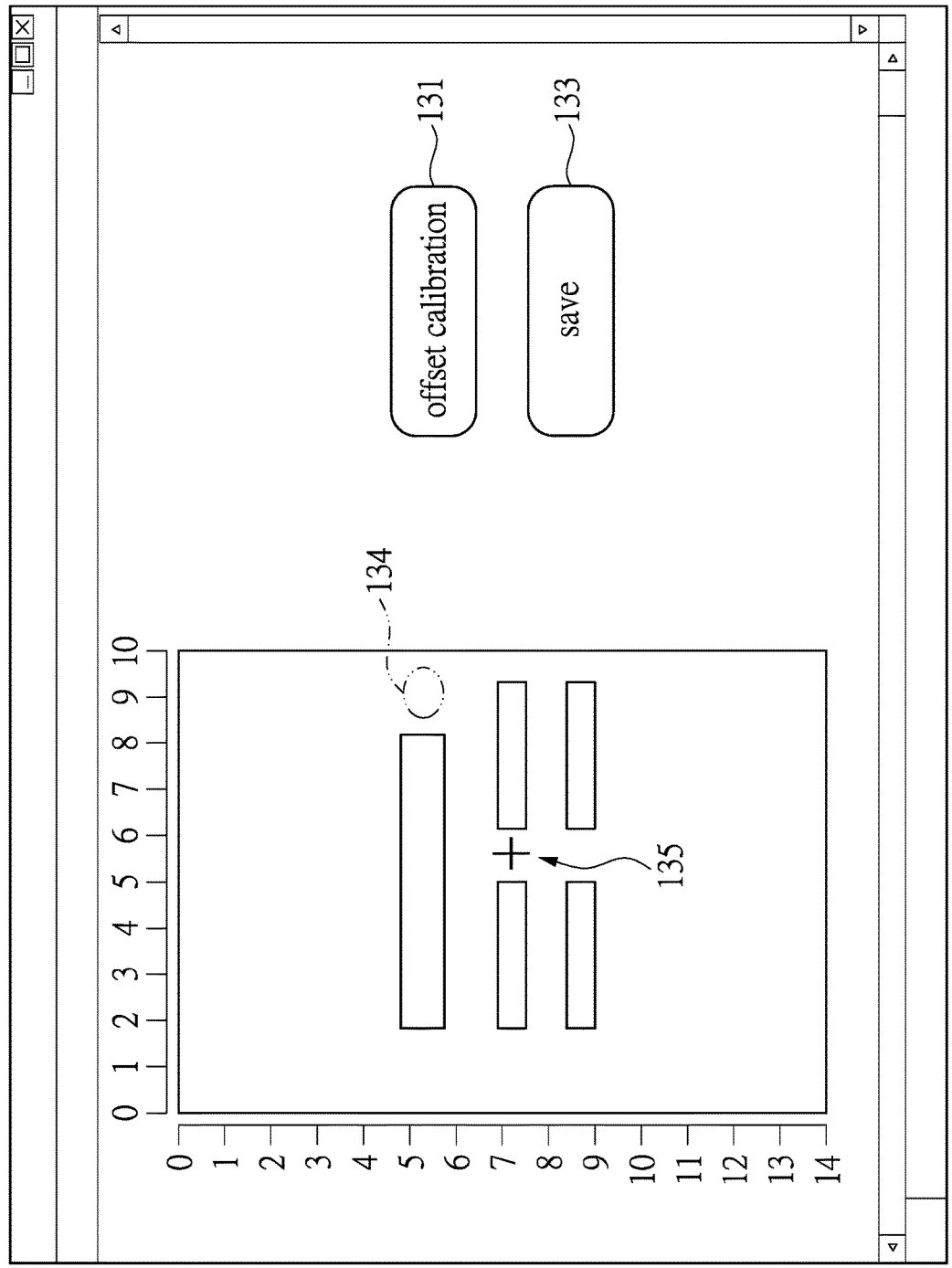

FIG. 12 shows another computer-implemented user interface that is provided for the user to define sample priority and ratio on index die or wafermap area or wafermap zone.

The user interface allows the user to click one index die 121 using the computer mouse or through the touch panel; select multiple index dies; selecting a certain area of wafermap; or selecting a range of the index die. The selected one or more index dies, a certain area of wafermap or index die, or even the area of a baseline window, or additional one or more delta parameters. This web-based user interface exemplarily shows the priority and ratio buttons such as priority 1, priority 2, priority 3, ratio 1, ratio 2, and ratio 3 that are provided for the user to configure a priority and a ratio of selection sampling. The related software decides a priority of sampling the defect groups or defect wafermaps, and orderly performs defect sampling according to a defect priority of defects, defect groups, and defect wafermaps.

In view of the issued U.S. Pat. No. 8,473,223 and U.S. Pat. No. 8,312,401, an offset calibration GUI in accordance with present invention is employed to initiate the function of calibrating the offset of the defect inspection machine in addition to the conventional calibration that compares a calibration image for conducting the calibration. The computer system generates a defect design pattern with a reference point 135 and a ruler that are displayed in a computer screen. Through the computer screen, the user can browse the defect design patterns including the reference point 135 and the ruler, and the defect image. The user can manipulate the mouse cursor or finger touch point to move the real defect image (134) to the position corresponding to the relative position of the defect design pattern. After clicking an offset calibration button 131, a horizontal and vertical coordinates or distances can be obtained and then the offset produced by defect inspection equipment can be calibrated. The calibrated data can be saved to the hard disk or any memory of the system when the save button 133 is clicked.

Through the mentioned GUI-based defect analysis system, the background software modules are used to perform filtering, merging, selection, configuring sampling priority and ratio, and offset calibration for the inspection machine. Therefore, the accuracy, diversity, and efficiency of the killer defect or weak defect pattern group sampling can be improved.

Thus, the hardware and software-implemented system embodying the method of intelligent defect classification and sampling and pattern recognition in accordance with the present invention may be applied to different stages in the fabrication process. For example, the method is applicable to the semiconductor wafer manufacturing process in Fab, the process in assembly house (ex. 3D IC process, and wafer bump process, etc.), the mask house, and furthermore to the manufacturing process for printed circuit board, carrier board, flexible board, flat display panel, light-emitting diode (LED), or solar cell. In the process, the defect patterns are obtained through scanning the device under test; the killer defects are obtained through screening the non-killer defect patterns; and the defect signature patterns can be obtained through pattern recognition. The meaningful defects affecting the manufacturing process can be found by the defect sampling. The method and system are able to speed up having the defect signature patterns and defect sampling for the defect diagnosis.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A computer-implemented intelligent defect classification and sampling system, which is executed by a computer system embodies an intelligent random defect sampling software engine as a defect sampling subsystem, the defect sampling subsystem comprises:

a defect screen module, by a processor, employs a screen threshold to screen out a non-killer defects and a killer defect, the non-killer defect is smaller than the screen threshold and the killer defect is larger than the screen threshold, and the screen threshold is to determine a killer defect pattern of defect patterns, which includes a high risk killer defect with a higher killer defect index and a low risk killer defect with a lower killer defect index, and the defect screen module having killer defect indexes which is defined based on layout based defect pattern groups, used to determine type of killer defect pattern of an object to be tested according to the killer defect indexes;

a defect classification module, by a processor, is provided for performing defect pattern classification and signature defect classification upon the defect pattern groups, wherein the defect classification module utilizes a defect pattern groups, wherein the defect classification module utilizes a defect coordinates transformation to compare with a well-defined defect patterns to find out the layer of the defects;

determining if the defect coordinates in a current layer is complied with the defect coordinates in a previous layer by comparing with the defect coordinates among the layers to find out the process defect; and performing signature defect classification to acquire signature patterns of a device under test, wherein the signature patterns are sampled from a mask defect and the wafermap signature pattern defect, and to compare with a wafer defect diagram for determining if it is matched with the signature pattern library; and a defect sampling module, by a processor, which is provided for continuously sampling the classified defect pattern group that is from the defect screen module and is provided for performing a risk-level killer defect sampling, an index die sample selection, a design layout pattern defect sample selection, a signature defect sampling and a process defect sampling, in which the risk-level killer defect sampling is used to sample high risk to low risk killer defects according to a risk level, the index die sampling selection is performed according to a predetermined priority which is directed a wafermap to be defect sampled, the design layout pattern defect sample selection is performed to selection sampling onto the layout pattern that obtained from a design house, the signature defect sampling is performed to the defects of the wafermap; and the process defect sampling is performed to sample the defects wherein the defect is found in a manufacturing process and an equipment;

thereby, one or more weak defect patterns obtained through sampling is based on a failure probability of weak pattern using a critical area analysis, so as to obtain defect layout pattern that result in open or short circuit.

2. The system according to claim 1, wherein the killer defect indexes include a higher killer defect index that indicates the high risk killer defect and a lower killer defect index that indicates the low risk killer defect.

3. The system according to claim 1, wherein the defect classification module is used to classify the defect pattern formed on a wafer area and its peripheral circuit layout area, NMOS layout area, PMOS layout area, vertical and horizontal polygon layout area, or a metal gate of transistor.

4. The system according to claim 1, wherein the defect classification module is used to classify the defects produced in the manufacturing process so as to obtain previous layer's defects, random particle defects, and residue defects.

5. The system according to claim 1, wherein the defect sampling module employs a killer defect index to be a threshold to determine type of the killer defect pattern of the defect pattern.

6. The system according to claim 1, further comprising a pre-processed GDS data library used to store design files; an index die wafermap or reticle shot wafermap library used to record images of device under test; a design layout library used to store the layout diagram from the design house; a library for defect inspection data from Fab obtained by an inspection tool; and killer defect index data library used to record the various killer defect indexes.

7. An intelligent defect classification and sampling method which is executed by a computer system with using a defect inspection tool over a specific wafer, comprises: obtaining a killer defect index by a defect screen module, which is referred to for determining type of the killer defect pattern of an object to be tested;
classifying the defect pattern and signature defect classification upon the defect pattern groups with a defect coordinates transformation to compare with the defined defect patterns to find out the layer of the defects by a defect classification module; performing risk-level killer defect sampling for sampling high and low risk killer defects by a defect sampling module according to a risk level, performing index die sampling selection to decide a wafermap to be defect sampled according to a priority, performing design layout pattern defect sampling selection with respect to a defect diagram from a design house, performing signature defect sampling with respect to the defects of the wafermap and performing process defect sampling upon the defects produced in the manufacturing process and an equipment; wherein the method comprises:
acquiring an in-line scanned defect inspection file from a wafer fab or a manufacturing plant;
performing a scanning and acquiring defect pattern of the object to be tested;
recognizing defect signature pattern from the defect pattern, wherein an image processing means is used to obtain contour of defect pattern through a geographic recognition and store the recognized defect signature patterns; and
using a browsing system to browse the defect pattern.

8. The method according claim 7, wherein a signal is launched when the defect signature pattern is recognized as using the browsing system to display the defect pattern.

9. The method according claim 7, wherein the image processing means is used to divide the scanned defect image into multiple areas, image clarification, and scan edge of the defect pattern, and recognize contour of the defect pattern.

10. An intelligent defect classification and sampling system which is executed by a computer-readable storage device, comprises:
a defect screen module, by a processor, employs a screen threshold to screen out a non-killer defects and a killer defect, the non-killer defect is smaller than the screen threshold and the killer defect is larger than the screen threshold, and the screen threshold is to determine a killer defect pattern of defect patterns, which includes a high risk killer defect with a higher killer defect index and a low risk killer defect with a lower killer defect index, and the defect screen module, having killer defect indexes which is defined based on layout based defect pattern group, used to determine type or killer defect pattern of an object to be tested according to the killer defect indexes;
a defect classification module, by a processor, is provided for performing defect pattern classification and signature defect classification upon the defect pattern group, wherein the defect classification module utilizes a defect coordinates transformation to compare with a well-defined defect patterns to find the layer of the defects;
determining if the defect coordinates in a current layer is complied with the defect coordinates in a previous layer by comparing with the defect coordinates among the layers to find out the process defect; and
performing signature defect classification to acquire signature patterns of a device under test, wherein the signature patterns are sampled from a mask defect and the wafermap signature pattern defect, and to compare with a wafer defect diagram for determining if it is matched with the signature pattern library; and
a defect sampling module, by a processor, which is provided for continuously sampling the classified defect layout pattern group that is from the defect screen module and is provided for performing a risk-level killer defect sampling, an index die sample selection, a design layout pattern defect sample selection, a signature defect sampling and a process defect sampling, in which the risk-level killer defect sampling is used to sample high risk to low risk killer defects according to a risk level, the index die sample selection is performed according to a predetermined priority which is directed a wafermap to be defect sampled, the design layout pattern defect sample selection is performed to selection sampling onto the layout pattern that obtained from a design house, the signature defect sampling is performed to the defects of the wafermap, and the process defect sampling is performed to sample the defects, wherein the defect is found in a manufacturing process and an equipment.

11. The intelligent defect classification and sampling system according to claim 10, comprising:
a web interface module initiating a defect analysis graphical user interface including a display area used to display a plurality of wafer defect patterns, and a plurality of selection buttons for performing defect analysis; wherein every wafer defect pattern belongs to a specific defect pattern group.

12. The intelligent defect classification and sampling system according to claim 11, wherein the selection button includes: a filter button for performing defect screening; a merge button for merging the defects with similar defect pattern from different defect pattern groups; a selection button for performing selection sampling; a priority button for configuring a priority and a ratio of selection sampling; and an offset calibration button for calibrating offset produced by defect inspection equipment.

* * * * *